United States Patent
Ishikawa et al.

(10) Patent No.: US 10,409,112 B2
(45) Date of Patent: Sep. 10, 2019

(54) LIQUID CRYSTAL DISPLAY DEVICE

(71) Applicant: Japan Display Inc., Tokyo (JP)

(72) Inventors: Tomokazu Ishikawa, Tokyo (JP); Yuki Kuramoto, Tokyo (JP); Hiroshi Miyairi, Tokyo (JP); Ryota Kobayashi, Tokyo (JP); Katsuto Sugimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/423,729

(22) Filed: Feb. 3, 2017

(65) Prior Publication Data

US 2017/0235167 A1    Aug. 17, 2017

(30) Foreign Application Priority Data

Feb. 17, 2016    (JP) ................. 2016-027833

(51) Int. Cl.
*G02F 1/1337* (2006.01)
*G02F 1/1333* (2006.01)
(Continued)

(52) U.S. Cl.
CPC .......... *G02F 1/1337* (2013.01); *G02F 1/1368* (2013.01); *G02F 1/133345* (2013.01);
(Continued)

(58) Field of Classification Search
CPC ............. G02F 1/1337; G02F 1/136227; G02F 1/133345; G02F 1/134363; G02F 1/133707; G02F 2001/134372; H01L 27/1248
See application file for complete search history.

(56) References Cited

U.S. PATENT DOCUMENTS

2004/0027503 A1    2/2004  Tanaka
2004/0070709 A1*   4/2004  Kanou .............. G02F 1/133553
                                                        349/113
(Continued)

FOREIGN PATENT DOCUMENTS

JP    2002-229062 A    8/2002
JP    2003-177396 A    6/2003
(Continued)

OTHER PUBLICATIONS

Japanese Office Action dated Jul. 23, 2019 for the corresponding Japanese Patent Application No. 2016-027833 with partial English translation.

*Primary Examiner* — Michael H Caley
*Assistant Examiner* — Mariam Qureshi
(74) *Attorney, Agent, or Firm* — Michael Best & Friedrich LLP

(57) ABSTRACT

A liquid crystal display device has pixels in a TFT substrate, each of the pixels has a TFT. An organic insulting film 108 is formed to cover the TFT. A first electrode 109 and a second electrode 111 are formed above the organic insulting film 108 with an inorganic insulating film 110 placed between the first electrode 109 and the second electrode 111. An alignment film is formed on the first electrode 109 and the second electrode 111. The second electrode 111 connects with the TFT through a contact hole formed in the organic insulating film 108. A cross section of the organic insulating film 108 that includes the contact hole and is parallel to the second direction has a convex section and a concave section 70 at a bank located near the contact hole, the convex section being located closer to the contact hole than the concave section 70.

9 Claims, 18 Drawing Sheets

(51) Int. Cl.
*G02F 1/1335* (2006.01)
*G02F 1/1362* (2006.01)
*G02F 1/1368* (2006.01)
*H01L 27/12* (2006.01)
*G02F 1/1343* (2006.01)

(52) U.S. Cl.
CPC .. *G02F 1/133512* (2013.01); *G02F 1/136227* (2013.01); *G02F 1/136286* (2013.01); *G02F 2001/133357* (2013.01); *G02F 2001/133776* (2013.01); *G02F 2001/134372* (2013.01); *H01L 27/124* (2013.01); *H01L 27/1248* (2013.01)

(56) References Cited

U.S. PATENT DOCUMENTS

| | | | | |
|---|---|---|---|---|
| 2004/0183967 | A1* | 9/2004 | Kim | G02F 1/1335 349/113 |
| 2004/0227894 | A1* | 11/2004 | Kim | G02F 1/133707 349/145 |
| 2006/0076560 | A1* | 4/2006 | Eguchi | G02F 1/136213 257/59 |
| 2009/0103031 | A1* | 4/2009 | Yamaguchi | G02F 1/134363 349/138 |
| 2009/0284693 | A1* | 11/2009 | Adachi | G02F 1/133555 349/98 |
| 2010/0328290 | A1* | 12/2010 | Jeong | G02F 1/133555 345/211 |
| 2012/0038873 | A1* | 2/2012 | Kim | G02F 1/133512 349/138 |
| 2014/0028942 | A1* | 1/2014 | Takeuchi | G02F 1/136227 349/43 |

FOREIGN PATENT DOCUMENTS

| | | |
|---|---|---|
| JP | 2008268844 A | 11/2008 |
| JP | 2011013677 A | 1/2011 |

* cited by examiner

LIQUID CRYSTAL DISPLAY DEVICE

CLAIM OF PRIORITY

The present application claims priority from Japanese Patent Application JP 2016-027833 filed on Feb. 17, 2016, the content of which is hereby incorporated by reference into this application.

BACKGROUND OF THE INVENTION

1. Field of the Invention

The present invention relates to display devices and particularly to a high-resolution liquid crystal display device (LCD) that prevents display unevenness that results from the presence of regions where an alignment film is not formed.

2. Description of the Related Art

A typical LCD includes a thin film transistor (TFT) substrate, a counter substrate, and a liquid crystal layer placed between them. On the TFT substrate, pixels each having a pixel electrode, a TFT, and the like are formed in the form of a matrix. Images are produced by controlling the transmittance rate of light passing through the liquid crystal molecules on a pixel-by-pixel basis.

An organic passivation film is formed to cover the TFT, and a common electrode, the pixel electrode, and an insulating film for insulating these electrodes are formed on the organic passivation film. The organic passivation film is formed thick (e.g., 2 to 4 μm thick) since it is designed to serve as a planarizing film and to reduce stray capacitance. Because contact holes are formed in this thick organic passivation film, the depths and taper angles of the contact holes become larger, making it difficult for an alignment film to enter the contact holes.

Since the organic passivation film is formed thick, it has been proposed that the organic passivation film perform various functions. In JP-A-2003-177396, for example, concave and convex sections are formed in the organic passivation film at the display area, and a metal reflection film is formed on that uneven surface, thereby forming a Lambertian surface.

Also, in JP-A-2002-229062, the thickness of the organic passivation film is changed for each pixel (red, green, and blue pixels). By doing so, the thickness of the liquid crystal layer in each pixel is also made to change, whereby the optimal thickness of the liquid crystal layer can be achieved for each color pixel.

SUMMARY OF THE INVENTION

The screen resolution of LCDs, especially small ones, is being enhanced. Enhancing resolution requires the area of each pixel to be reduced. This means that within a pixel, the area of the contact hole that is used to connect the pixel electrode to the source electrode of the TFT occupies a larger portion of that pixel. Moreover, the distance between the contact hole in a pixel and the contact hole in another pixel is reduced as well.

In LCDs, an alignment film is formed to perform initial alignment on the liquid crystal molecules. The material of the alignment film is in the form of liquid at the time of application and baked to form the alignment film. As a contact hole becomes smaller, the material of the alignment film is more likely to be repelled and less likely to be formed in the contact hole. When the material of the alignment film does not flow into the contact hole, the thickness of the alignment film formed around the contact hole does not become uniform. In other words, at the edge of the alignment film that results from the material of the alignment film not flowing into the contact hole, the amount of the alignment film increases by the material of the amount that should have flowed into the contact hole. Also, due to the surface energy at the edge, the alignment film is formed thicker near the contact hole. If such a region where the alignment film has been formed thick passes a masked area and reaches a transmissive area, the voltage applied to the liquid crystal layer may decrease in that transmissive area, or the gaps in the liquid crystal layer at the transmissive area may be smaller than in other areas. Thus, the display quality in the transmissive area may be reduced (dim-colored spots) relative to other regions.

Typically, each contact hole is masked by a black matrix. Thus, even if the alignment film is not formed in each contact hole, this does not pose a serious problem. However, as stated above, if regions where the alignment film has nonuniform thicknesses reach a transmissive area (i.e., area not masked by a black matrix), this does pose a problem. Moreover, regions where the alignment film is not formed may be connected to one another across several pixels. In such a case, the regions where the alignment film is not formed reach a display area, thus lowering display quality. Therefore, high-resolution LCDs are prone to the nonuniformity of alignment film thickness and enlarged regions where the alignment film is not formed, for the pixel pitch is small in such LCDs.

FIG. 4 illustrates an example of such display unevenness. As illustrated in FIG. 4, a display area 500 shows signs of display unevenness 50 in an isolated manner. Regions where the thickness of the alignment film is not uniform are present in multiple pixels, and those regions cause display unevenness.

Such occurrence of display unevenness can be prevented to some extent by adjusting the shape of each contact hole, the material of the alignment film, or printing conditions. However, these methods cannot be sufficient countermeasures because the organic passivation film cannot be reduced in thickness, or because the diameter of each contact hole cannot be reduced limitlessly, or because adjusting the printing conditions increases the process load.

An object of the present invention is thus to prevent the phenomenon of the alignment film not being formed in contact holes and reduce display unevenness resulting from light leakage.

Means for Solving the Problems

To solve the above problems, the invention provides a liquid crystal display device including: a TFT substrate having gate lines extending in a first direction and arranged in a second direction, video signal lines extending in the second direction and arranged in the first direction, and pixels formed by the intersecting gate lines and video signal lines; a counter substrate; and a liquid crystal layer placed between the TFT substrate and the counter substrate. In each of the pixels, an organic insulting film is formed to cover a TFT. A first electrode and a second electrode are formed above the organic insulting film with an inorganic insulating film placed between the first electrode and the second electrode. An alignment film is formed on the first electrode and the second electrode. The second electrode and the TFT are connected to each other via a contact hole formed in the organic insulating film. A cross section of the organic insulating film that includes the contact hole and is parallel to the second direction has a convex section and a concave section at a bank located near the contact hole, the convex section being located closer to the contact hole than the concave section.

DESCRIPTION OF THE PREFERRED EMBODIMENTS

Embodiments of the present invention will now be described in detail.

Figure 1:
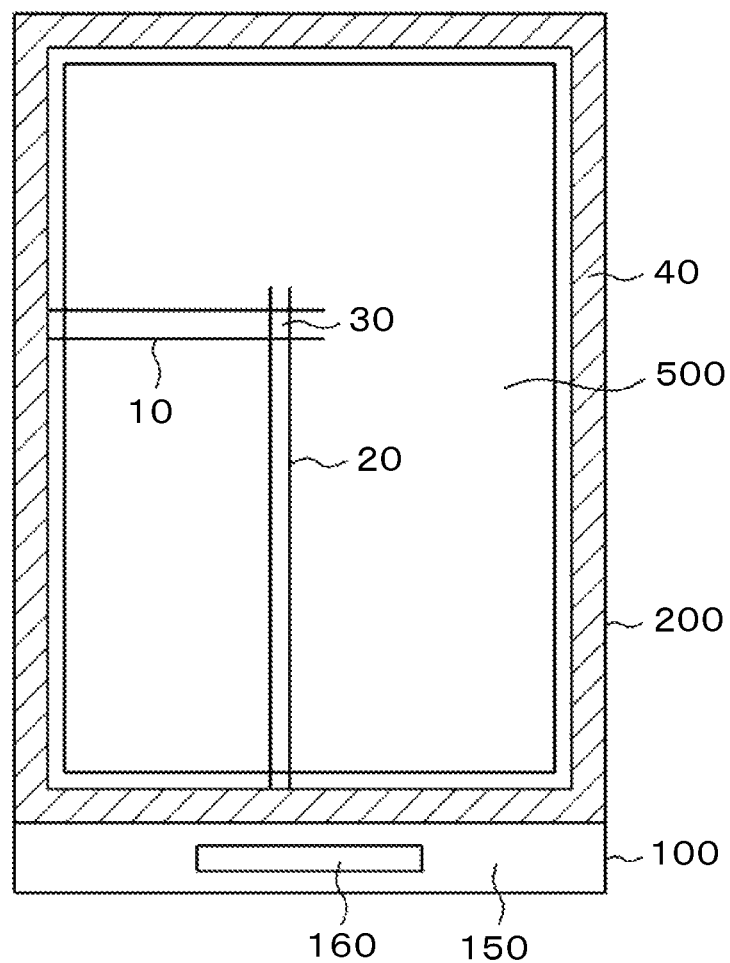
FIG. 1 is a plan view of an LCD according to the invention.

FIG. 1 is a plan view of an LCD to which the invention is applied. In FIG. 1, a TFT substrate 100 and a counter substrate 200 are glued by a sealing material 40, and a liquid crystal layer is sandwiched between the TFT substrate 100 and the counter substrate 200. The TFT substrate 100 is formed larger than the counter substrate 200, and the section of the TFT substrate 100 that does not overlap any other layer serves as a terminal section 150. Formed at the terminal section 150 are an IC driver 160 for driving an LCD panel and terminals to which to connect a flexible printed circuit board for supplying to the LCD panel electric power, video signals, clock signals, and so on.

As illustrated in FIG. 1, within a display area 500, gate lines 10 extend in a first direction and are arranged in a second direction. Also, video signal lines 20 extend in the second direction and are arranged in the first direction. The areas surrounded by two gate lines 10 and two video signal lines 20 each constitute a pixel 30. In the case of a high resolution LCD, the area of the pixel 30 is considerably small, with its sides parallel to the extending direction of the video signal lines 20 being 78 µm or less, and its sides parallel to the extending direction of the gate lines 10 being 26 µm or less. The pixel 30 can be a red, green, or blue subpixel. Although a set of red, green, and blue subpixels is often referred to as a pixel, we refer to a red, green, or blue subpixel simply "a pixel 30" unless otherwise specified.

Figure 2:
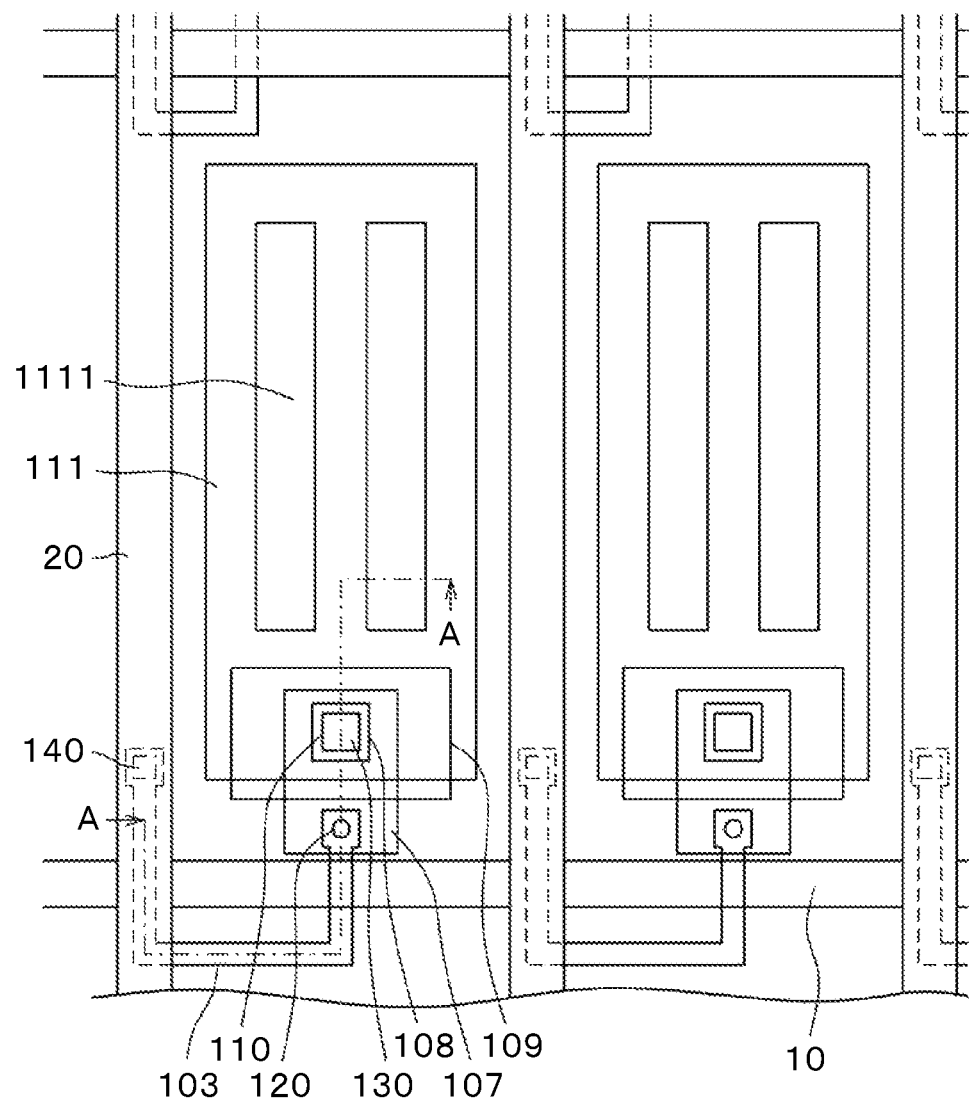
FIG. 2 is a plan view illustrating the pixel structure of Embodiment 1 of the invention.

FIG. 2 is a plan view of two pixels 30 on the TFT substrate 100. As illustrated in FIG. 2, the two pixels 30 are arranged side by side in a horizontal direction. More specifically, FIG. 2 is a plan view illustrating pixels on an In-Plane Switching (IPS) LCD. Note however that although the following description is based on the assumption that the invention is applied to an IPS LCD, the invention can also be applied to other types of LCDs.

As illustrated in FIG. 2, gate lines 10 extend horizontally and are arranged vertically while video signal lines 20 extend vertically and are arranged horizontally. A pixel electrode 111 is formed in each of the areas surrounded by two gate lines 10 and two video signal lines 20. In FIG. 2, a U-shaped semiconductor layer 103 extends from a through-hole 140, passing under a gate line 10 twice. The two sections of the gate line 10 under which the semiconductor layer 103 passes serve as TFTs. In other words, those sections of the gate line 10 serve as gate electrodes. The semiconductor layer 103 is connected to a contact electrode 107 at a through-hole 120, and the contact electrode 107 is connected to the pixel electrode 111 at a contract hole 130. The pixel electrode 111 has slits 1111 formed thereon. Although FIG. 2 illustrates the pixel electrode 111 as having multiple bars and the slits 1111, it can instead be a single linear electrode without slits.

In this specification, we use the term "though-hole" to refer to the portion that connects the semiconductor layer 103 to a video signal line 20 or to the contact electrode 107, and we used the term "contact hole 130" to refer to the portion that connects the contact electrode 107 to the pixel electrode 111. The though-hole and the contact hole share the same functions. The contact hole 130, however, has a larger diameter because it is created by forming a hole in an organic passivation film.

Contact holes are cone-shaped concave sections, but the contact hole 130 of FIG. 2 is meant to refer to a hole located at the bottom of the contact hole. In FIG. 2, the reference numeral 108 denotes the edge of an organic passivation film at the bottom of the contact hole, and the reference numeral 110 denotes the edge of a capacitor insulating film at the bottom of the contact hole. Also, the reference numeral 109 of FIG. 2 denotes the opening of a common electrode 109. Each of the shapes denoted by the reference numerals 108 and 110 is a rectangle, but can instead be a polygon or circle.

Because a large concave section is formed at the contact hole 130, an alignment film material is repelled by the concave section at the time of applying the material, which makes it difficult for the material to enter the contact hole 130. It should be noted that, hereinafter, the alignment film material may be referred to simply as "the alignment film." When the alignment film is merely repelled by only the contact hole 130, display unevenness is less likely to be noticed. However, because of the alignment film repelled, the thickness of the alignment film deposited around the contact hole becomes large, which may result in reduced display quality. Moreover, if the region repelled by a contact hole connects to the region repelled by another contact hole, the whole region where the alignment film is not formed becomes large, worsening display unevenness. Hereinafter, regions where the alignment film is not formed are also called alignment film repelled regions.

Figure 3:
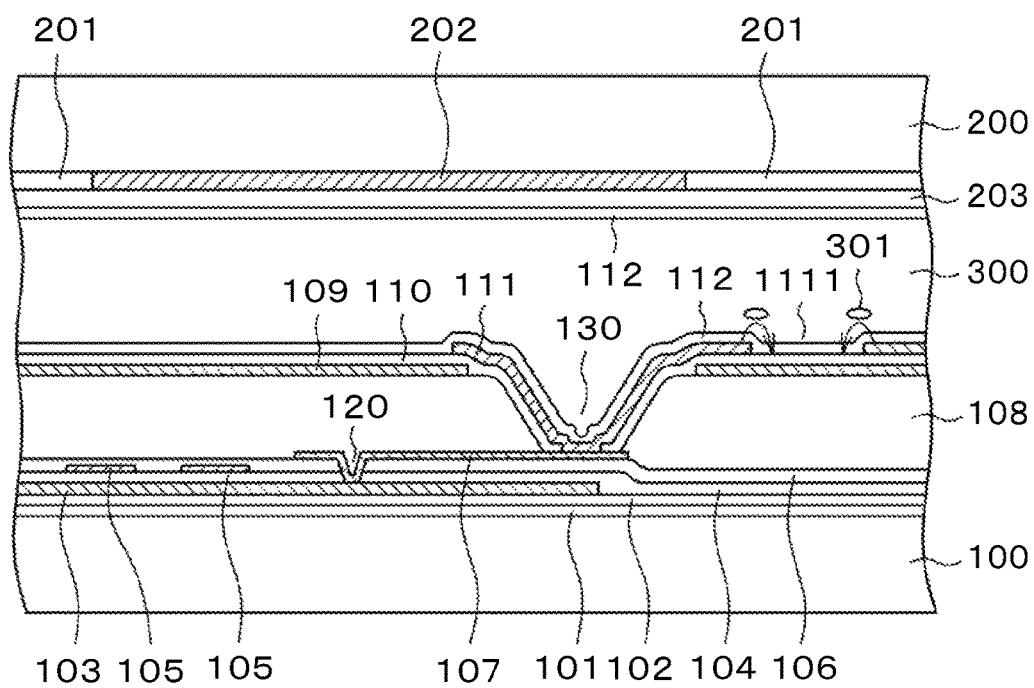
FIG. 3 is a cross section taken along line A-A of FIG. 2.

FIG. 3 is a cross section taken along line A-A of FIG. 2. The TFT of FIG. 3 is a so-called top-gate TFT, and the semiconductor used therein is low temperature polycrystalline silicon (LTPS). As illustrated in FIG. 3, a first undercoat film 101 made from SiN and a second undercoat film 102 made from $SiO_2$ are formed on a TFT substrate 100 of e.g. glass by chemical vapor deposition (CVD). The first undercoat film 101 and the second undercoat film 102 play the role of preventing the semiconductor layer 103 from being contaminated by impurities from the TFT substrate 100 of e.g. glass.

The semiconductor layer 103 is formed on the second undercoat film 102. The semiconductor layer 103 is formed by first depositing an amorphous silicon (a-Si) film on the second undercoat film 102 by CVD and then laser-annealing the film to convert it into a polysilicon (poly-Si) film. This poly-Si film is subjected to photolithographic patterning.

Formed on the semiconductor layer 103 is a gate insulating film 104, which is an $SiO_2$ film formed from tetraethoxysilane (TEOS). The gate insulating film 104 is also deposited by CVD. Formed on the gate insulating film 104 are gate electrodes 105. The gate line 10 illustrated in FIG. 2 acts as the gate electrodes 105. Since the semiconductor layer 103 passes under the gate line 10 twice, it follows that two gate electrodes 105 are formed, as illustrated in FIG. 3. The gate electrodes 105 are each formed, for example, of a molybdenum-tungsten (MoW) film.

An inter-layer insulating film 106 made from $SiO_2$ is formed to cover the gate electrodes 105. The inter-layer insulating film 106 is used to insulate the gate electrodes 105 from the contact electrode 107. Formed in the inter-layer insulating film 106 and the gate insulating film 104 is the through-hole 120, which connects the semiconductor layer 103 and the contact electrode 107. The photolithography needed to form the through-hole 120 is simultaneously performed on the inter-layer insulating film 106 and the gate insulating film 104.

A video signal line 20 is formed on the inter-layer insulating film 106. At the though-hole 140 shown in FIG. 2, the video signal line 20 is connected to the semiconductor layer 103. It thus follows that two TFTs are formed between the through-hole 140 and the through-hole 120 that are illustrated in FIG. 2. The contact electrode 107 and the video signal line 20 are formed at the same level, i.e., on the inter-layer insulating film 106. The contact electrode 107 is connected to the pixel electrode 111 via the contact hole 130. The video signal line 20 and the contact electrode 107 are formed, for example, of an Al alloy, MoW, or a laminate of these materials.

An organic passivation film 108 is formed to cover the video signal line 20 and the contact electrode 107. The organic passivation film 108 is formed of a photosensitive acrylic resin; it can also be formed of a silicone resin, an epoxy resin, a polyimide resin, or the like. The organic passivation film 108 is formed thick because it needs to act also as a planarizing film. The thickness of the organic passivation film 108 is usually in the range of 2 to 4 μm, and it is about 3.5 μm in the present invention.

To establish an electric connection between the pixel electrode 111 and the contract electrode 107, the contact hole 130 is formed in the organic passivation film 108. After the application of the above-mentioned photosensitive resin, it is exposed to light, thereby causing only the light-exposed portions to melt into a particular developing solution. Thus, the use of the photosensitive resin makes a photoresist unnecessary. After the contact hole 130 has been formed in the organic passivation film 108, the film is baked at approximately 230 degrees Celsius, which finalizes the formation of the organic passivation film 108.

Thereafter, indium tin oxide (ITO) is sputtered to form the common electrode 109. Patterning is performed such that the sputtered ITO is removed from the contact hole 130 and its nearby area. The common electrode 109 is formed flat and shared by all the pixels. The capacitor insulating film 110 made from SiN is then formed over the entire surface by CVD. To establish an electric connection between the contact electrode 107 and the pixel electrode 111 at the contact hole 130, a though-hole is then formed in the capacitor insulating film 110. Thereafter, ITO is sputtered and patterned to form the pixel electrode 111. The planar shape of the pixel electrode 111 is illustrated in FIG. 2.

An alignment film material is applied onto the pixel electrode 111 by flexography printing, inkjet printing, or the like. The alignment film material is in the form of liquid at the time of the application, but it may not enter the contact hole 130 due to surface tension.

After the application of the alignment film material, it is baked to form an alignment film 112. To perform alignment treatment on the alignment film 112, either the rubbing method or the photo-alignment method with the use of ultraviolet light can be used. Voltage application between the pixel electrode 111 and the common electrode 109 results in such electric force lines as shown in FIG. 3. This electric field causes liquid crystal molecules 301 to rotate, thereby controlling the amount of light passing through a liquid crystal layer 300 on a pixel-by-pixel basis to produce an image.

As illustrated in FIG. 3, the counter substrate 200 is located across from the TFT substrate 100 with the liquid crystal layer 300 inserted therebetween. Formed underneath the counter substrate 200 are color filters 201. The color filter 201 of a pixel can be a red, green, or blue filter to produce a color image. A black matrix 202 is formed between the color filter 201 of a pixel and the color filter 201 of an adjacent pixel to increase image contrast. The black matrix 202 acts also as a light-blocking film for the TFT and prevents the flow of photocurrent to the TFT. The black matrix 202 covers the contact hole in a plan view.

Formed underneath the color filter 201 and the black matrix 202 is an overcoat 203. The overcoat 203 prevents components of the color filter 201 from diffusing into the liquid crystal layer. Underneath the overcoat 203 is another alignment film 112 to determine the initial alignment of the liquid crystals. To perform alignment treatment on this alignment film 112, either the rubbing method or the photo-alignment method can be used, as is similar to the alignment film 112 on the side of the TFT substrate 100.

Figure 4:
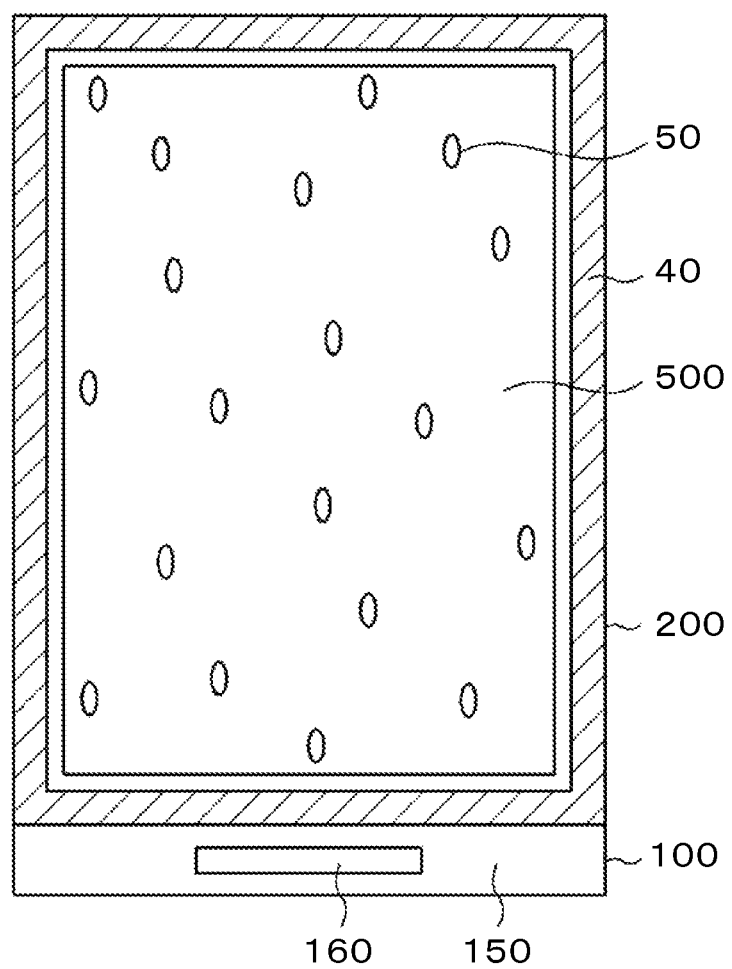
FIG. 4 illustrates an example of display unevenness that results from the presence of regions where an alignment film is not formed.

FIG. 4 illustrates an example of display unevenness that results from nonuniform thickness of the alignment film. Such display unevenness is attributed to the occurrence of regions where the alignment film does not enter the contact hole. The contact hole is covered by the black matrix formed on the counter substrate. However, if a region of the alignment film having a nonuniform thickness reaches an unmasked region, it is recognized as display unevenness. Also, when multiple regions where the alignment film is not formed are connected to one another, the problem of light leakage becomes more serious.

Figure 5:
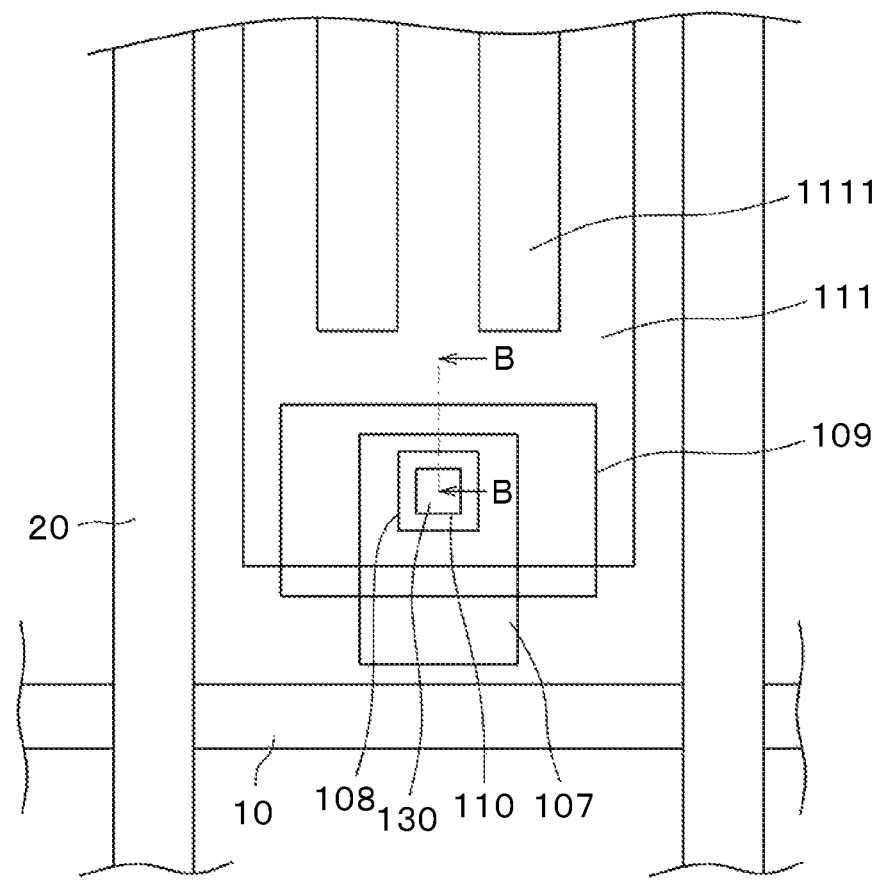
FIG. 5 is a plan view illustrating a contact hole and its nearby area.
Figure 6:
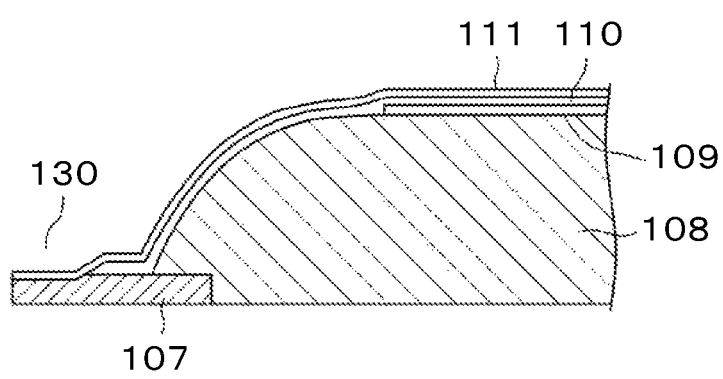
FIG. 6 is a cross section taken along line B-B of FIG. 5.

FIGS. 5 through 7 illustrate why the alignment film is not formed in the contact hole. FIG. 5 is an enlarged plan view of FIG. 2, illustrating the contact hole 130 and its nearby area. In FIG. 5, for simplification purposes, the semiconductor layer and the like are not illustrated. The reference numeral 109 in FIG. 5 denotes the opening of the common electrode, and the reference numeral 130 denotes the opening at the bottom of the contact hole of FIG. 3. Also, the reference numeral 110 denotes the opening of the capacitor insulating film 110, and the reference numeral 108 denotes the opening at the bottom of the contact hole in the organic passivation film 108. This also applies to the contact hole plan views that follow. We omit the explanation of the other reference numerals since it has already been made with reference to FIG. 2.

FIG. 6 is a cross section taken along line B-B of FIG. 5. In FIG. 6, the inter-layer insulating film and those layers located below it are not illustrated, and neither is the alignment film. As illustrated in FIG. 6, the contact hole 130 is formed in the organic passivation film 108 by photolithography, and the capacitor insulating film 110 is formed on the organic passivation film 108. Further, an opening is formed in the capacitor insulating film 110 by photolithography. In this opening, the contact electrode 107 and the pixel electrode 111 are connected. Although the common electrode 109 is formed on the organic passivation film 108, the common electrode 109 is removed from the contact hole 130 and its nearby area. In the case of a contact hole 130 having such a shape, the alignment film may not be formed in the contact hole.

Figure 7A:
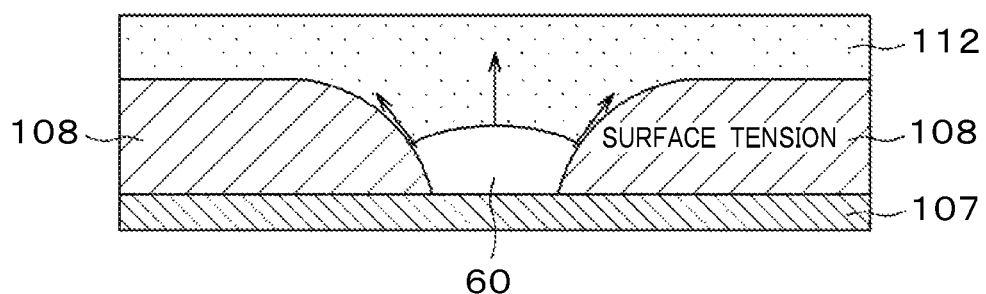
FIGS. 7A to 7C are cross sections illustrating the phenomenon of the alignment film not being formed in a contact hole.
Figure 7B:
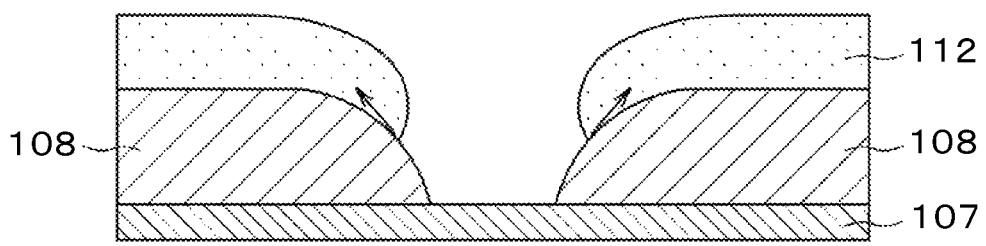
Figure 7C:
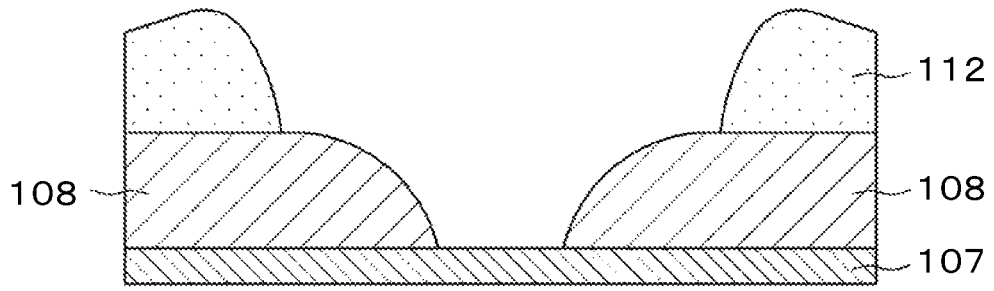

FIGS. 7A to 7C are schematic cross sections illustrating this phenomenon. In FIGS. 7A to 7C, only the relevant components are illustrated (for example, the organic passivation film 108 is illustrated, but the capacitor insulating film 110, the pixel electrode 111, and the like are not illustrated). The organic passivation film 108 is illustrated since it has a large thickness and thus has a great influence on the shape of the contact hole. Unillustrated components such as the capacitor insulating film 110, the pixel electrode 111, and the like are formed on the organic passivation film 108 and thus have cross-sectional shapes that extend substantially along the upper outline of the organic passivation film 108. FIG. 7A illustrates the state where the contact hole is formed in the organic passivation film 108 and the alignment film material 112 (liquid) is applied onto the organic passivation film 108. As illustrated in FIG. 7A, air 60 is trapped at the bottom of the contact hole. The air 60 moves upward, as the arrows indicate.

FIG. 7B illustrates the tendency of the alignment film material 112 to move toward the nearby area of the contact hole (i.e., toward stable positions) when separated by the air bubble 60. The arrows represent the moving directions of the alignment film material 112. FIG. 7C is a cross section illustrating regions where the alignment film material 112 exists stably. As illustrated in FIG. 7C, the alignment film 112 exists stably at the bank located outer periphery of the contact hole, and the alignment film material 112 is not present in the contact hole. In addition, the thickness of the alignment film is larger around the contact hole, which results in display unevenness.

Figure 8:
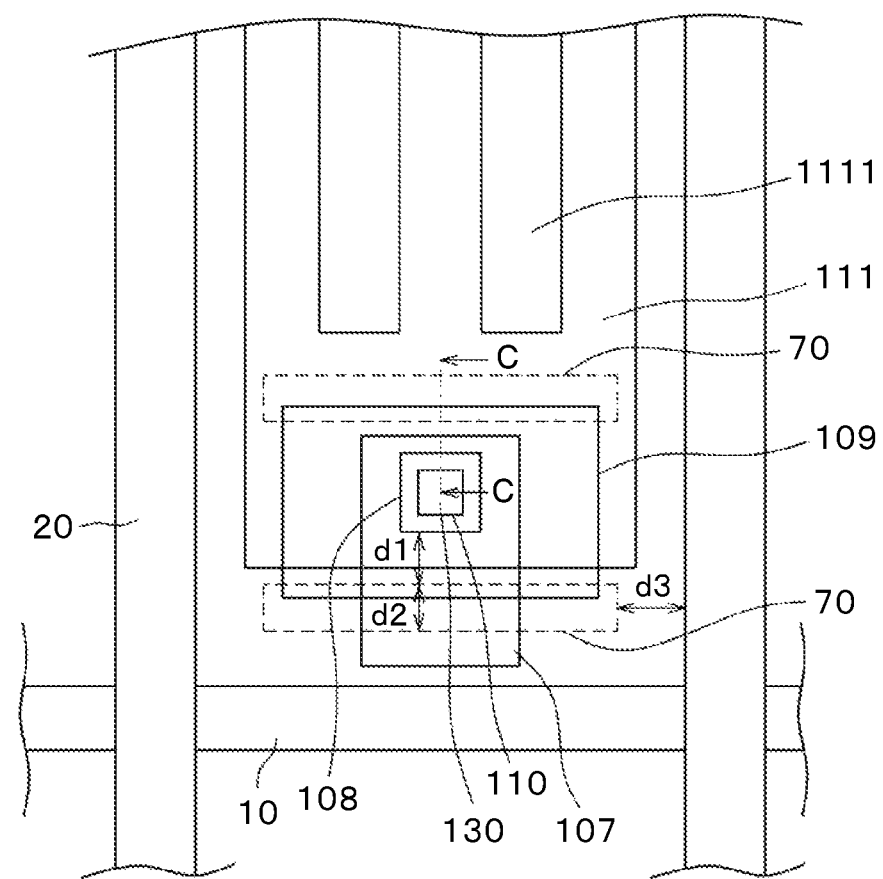
FIG. 8 is another plan view according to Embodiment 1.

FIG. 8 is a plan view illustrating the pixel structure of the invention that provides a countermeasure against the above problem. FIG. 8 is a plan view illustrating the contact hole 130 and its nearby area and is the same as FIG. 5 in terms of basic structure. FIG. 8 differs from FIG. 5 in that in the former, such concave sections as areas 70 are formed in the organic passivation film 108 near the contact hole 130.

Figure 9:
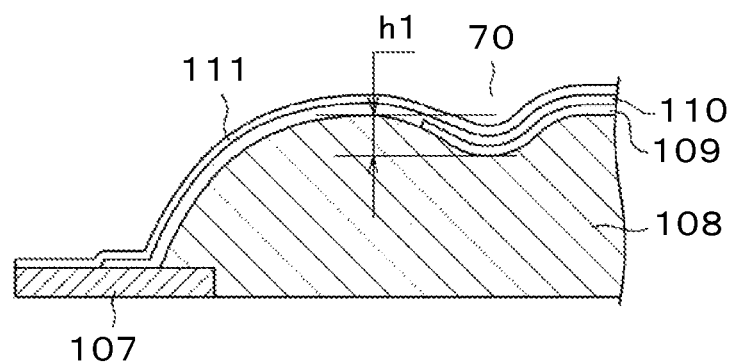
FIG. 9 is a cross section taken along line C-C of FIG. 8.

FIG. 9 is a cross section taken along line C-C of FIG. 8. As illustrated in FIG. 9, a concave section 70 having a depth h1 is formed on the bank of the organic passivation film 108 that is located near the contact hole 130. The depth h1 is in the range of approximately 0.3 to 1 μm. The depth h1 is the distance between the apex of the bank of the organic passivation film 108 and the bottom of the concave section 70 (the difference in distance from the substrate surface or from the surface of the inter-layer insulating film). Such concave sections 70 on the organic passivation film 108 can be formed by half exposure. In other words, several tens of percent of the light intensity used to form the contact hole 130 can be used to form the concave sections 70. Controlling the light intensity of half exposure allows the depth of the concave sections 70 to be controlled.

Since the concave sections 70 can be formed by half exposure, the process load does not increase. The common electrode 109, the capacitor insulating film 110, and the pixel electrode 111, all of which are formed above the organic passivation film 108, are formed along the shape of the organic passivation film 108 since such concave sections 70 are formed on the organic passivation film 108.

Figure 10A:
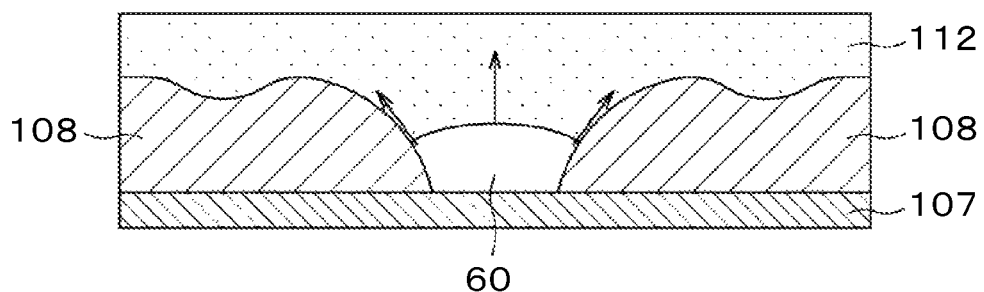
FIGS. 10A to 10C are cross sections illustrating how the invention works.
Figure 10B:
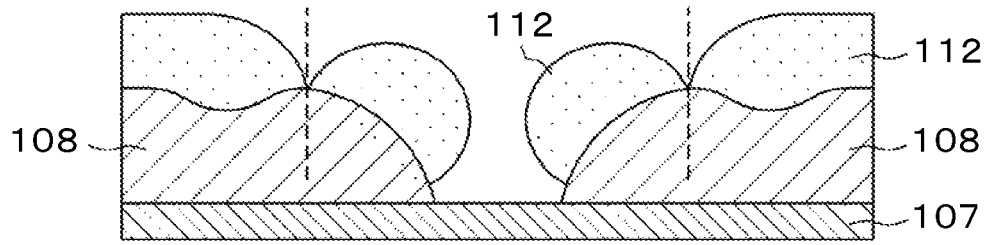
Figure 10C:
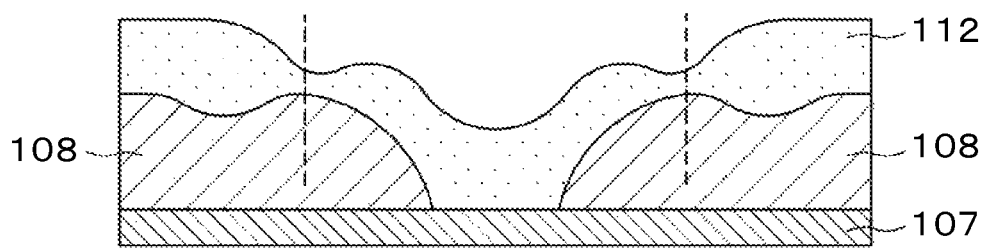

FIGS. 10A to 10C are schematic cross sections illustrating how shaping the nearby area of the contact hole 130 as illustrated in FIG. 9 prevents the phenomenon of the alignment film 112 not being applied onto the contact hole 130. As illustrated in FIG. 10A, the alignment film 112 is applied onto the organic passivation film 108 on which the contact hole 130 and concave sections 70 have been formed. Similar to FIG. 7A, the air bubble 60 is present at the bottom of the contact hole, and it moves upward.

FIG. 10B illustrates the state where the air bubble is released from the contact hole. As illustrated in FIG. 10B, by the concave sections being formed near the banks of the organic passivation film 108 that are located near the contact hole 130, convex sections are formed near the contact hole 130. With such convex sections, the region around the contact hole is no longer a stable position for the alignment film material 112. Because of the convex sections, the alignment film material 112 moves as if to be separated toward either the contact hole side or the concave section side with respect to the convex sections.

The alignment film material 112 that has moved toward the contact hole side flows toward the bottom of the contact hole 130, thereby filling it. This is illustrated in FIG. 10C.

Figure 11:
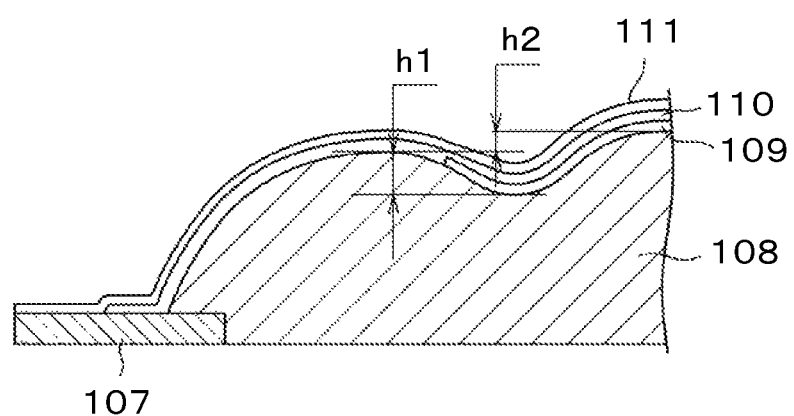
FIG. 11 is another cross section taken along line C-C of FIG. 8.

FIG. 11 is a schematic cross section illustrating the case where the organic passivation film 108 has a nonuniform height on both sides of a concave section near the contact hole. As illustrated in FIG. 11, a concave section is formed at a position where the thickness of a region of the organic passivation film 108 that is located closer to the contact hole 108 does not exceed those of other regions of the organic passivation film 108. As a result, the thickness of the convex section is smaller than the thickness of the bulk portion (i.e., display area) of the organic passivation film 108. In other words, the thickness of the convex section of the organic passivation film 108 (i.e., the height from the substrate surface) is smaller than that of the bulk portion of the organic passivation film 108 (i.e., the height from the substrate surface) by h2. In such a case, too, the depth of the concave section can be regarded as the difference h1 (distance) between the apex of the convex section and the bottom of the concave section.

Figure 12:
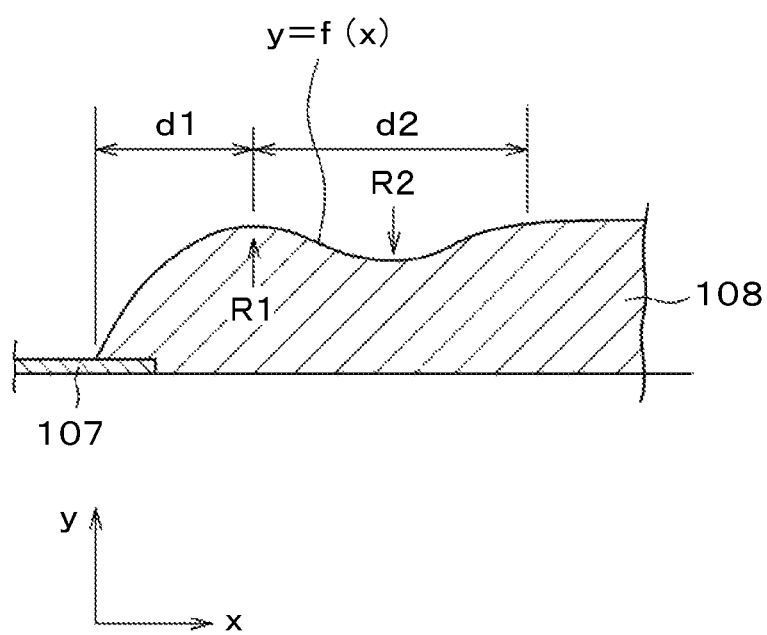
FIG. 12 is a cross section illustrating features of the invention.

FIG. 12 is a cross section illustrating the detailed shape of the organic passivation film 108. If the concave section of the organic passivation film 108 and the resultant convex section according to the invention are spaced too far from the contact hole 130, the effects of the invention will diminish. FIGS. 8 and 12 are diagrams illustrating the positions of the concave section and the convex section. As illustrated in FIG. 12, the width d2 of the concave section is defined as the distance from the convex section near the contact hole 130 to the point where the thickness of the organic passivation film 108 becomes constant. Also, the distance d1 is defined as the distance from the edge of the contact hole in the organic passivation film 108 to the apex of the convex section. The distances d1 and d2 of FIG. 12 correspond respectively to the distances d1 and d2 of FIG. 8 (plan view).

The effects of the present invention are great when the value of d1 is in the range of 2 to 5 μm and when the value of d2 is in the range of 2 to 5 μm. Also, the depth of the concave section is preferably in the range of 0.3 to 1 μm. It should be noted that the distance d3 of the concave section from a video signal line (FIG. 8) is 1 μm or higher in the present embodiment, although it has less influence than the distances d1 and d2.

As illustrated in FIG. 12, a feature of the invention is that when the nearby area of the contact hole 130 in the organic passivation film 108 is viewed in a cross section parallel to the extending direction of a video signal line 20, the cross-sectional shape of the organic passivation film 108 has a convex section first and then a concave section as it gets farther away from the edge of the contact hole 130. Assume that the edge of the organic passivation film 108 at the contact hole is zero, the same direction as the extending direction of the video signal line 20 (i.e., the lateral direction of FIG. 12) is x, and a direction perpendicular to the substrate is y. If the upper curve of the organic passivation film 108 is represented by y=f(x), then, the sign of the quadratic differential of the curve y with respect to x will change once.

In FIG. 12, the sign of the quadratic differential of f(x) is negative at the section R1 near the convex section of the organic passivation film 108; it turns positive at the section R2 near the bottom of the concave section. Thereafter, the sign of the quadratic differential of f(x) turns negative again as the value of x becomes larger.

Thus, the above feature of the invention can be paraphrased as the following: the region where the sign of f(x) changes for the first time appears when the distance of the organic passivation film 108 from the edge of the contact hole is in the range of 4 to 10 μm, and preferably in the range of 3 to 8 μm.

The function f(x) of FIG. 12 can often be approximated to $ax^2+bx^4$. In other words, if the upper curve y of the organic passivation film 108 is represented by $ax^2+bx^4$, the sign of the quadratic differential of the curve y with respect to x changes once.

Figure 13:
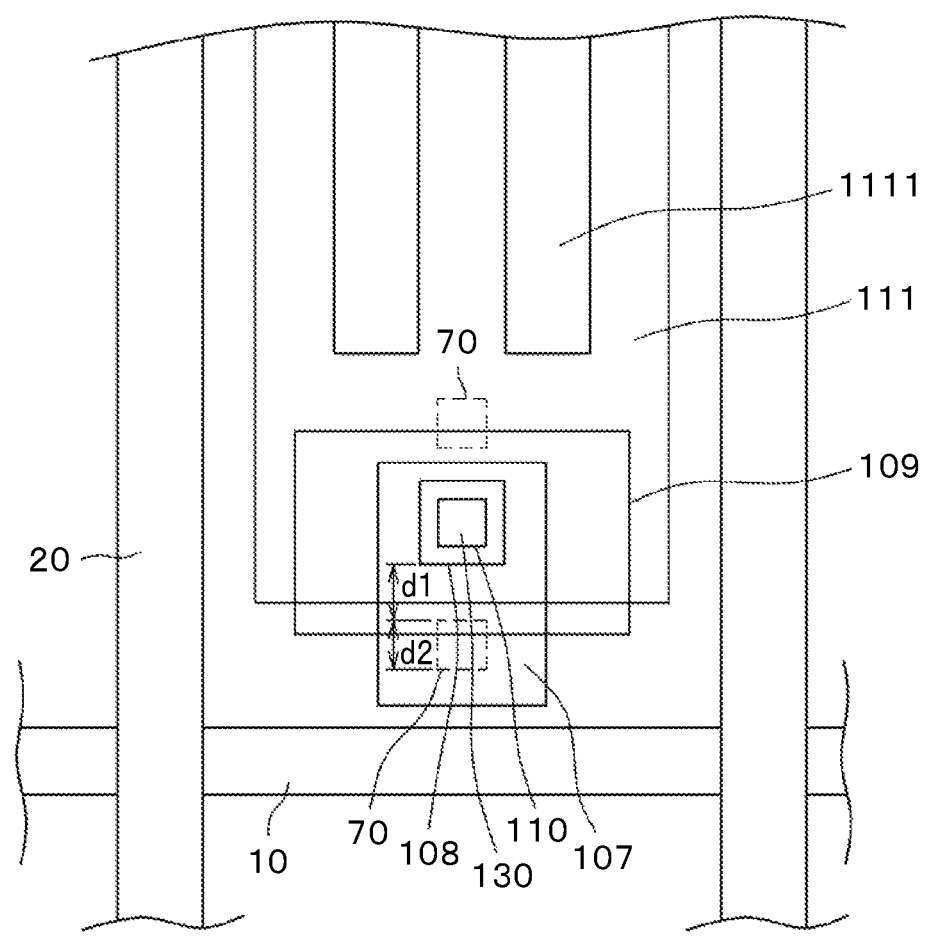
FIG. 13 is a plan view according to another example of Embodiment 1.

FIG. 13 is a plan view illustrating a contact hole 130 and its nearby area according to another aspect of the present embodiment. FIG. 13 differs from FIG. 8 in that in the former, the width of concave sections 70 parallel to the extending direction of a gate line is smaller. The concave sections 70 are designed to create an opportunity for the alignment film material to flow into the contact hole 130. Thus, if the width of the concave sections 70 cannot be increased much due to layout constraints, the shape of the concave sections 70 of FIG. 13 can be adopted. The values of d1, d2, and the like are the same as those mentioned in FIG. 8. Also, the depth of the concave sections 70 can be the same as that mentioned in FIG. 9 or smaller.

Figure 14:
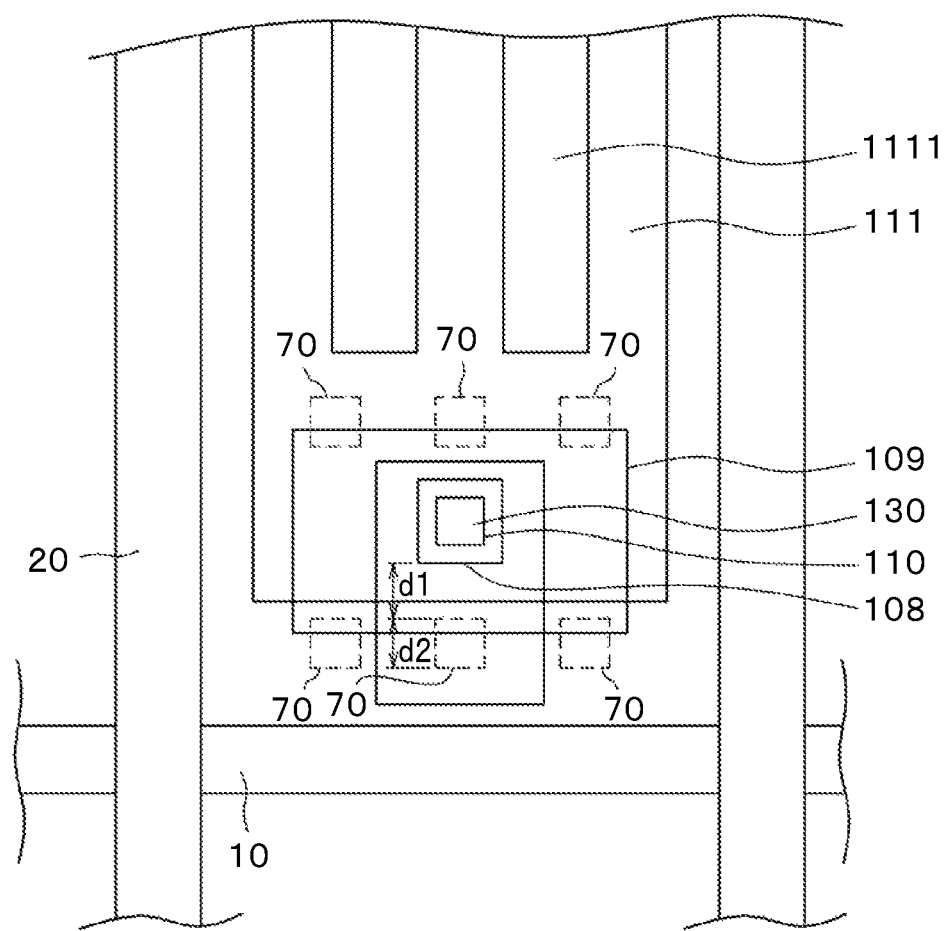
FIG. 14 is a plan view according to still another example of Embodiment 1.

In FIG. 14, three concave sections 70 whose width parallel to the extending direction of a gate line is small are formed and arranged in that direction. Each of the concave sections 70 is the same as those described in FIG. 13. Although the concave sections may be required to be spaced from each other in terms of in-pixel layout, this layout still makes the invention effective.

Figure 15:
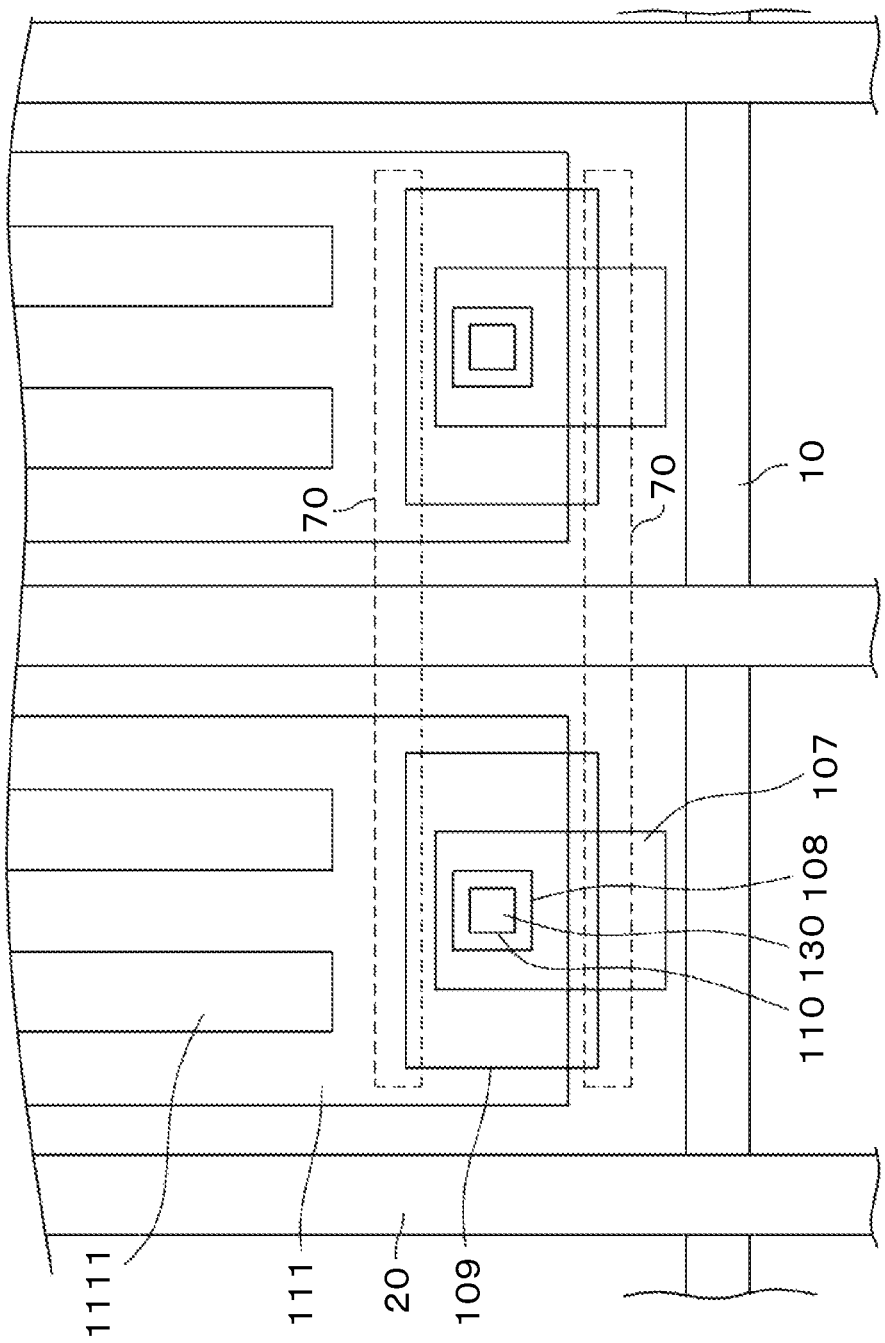
FIG. 15 is a plan view according to yet another example of Embodiment 1.

In FIG. 15, two concave sections 70 to be formed on the organic passivation film are shared by two pixels. Since the concave sections 70 are formed by half exposure, it would sometimes be better to create them all at once in terms of process conditions. This structure also allows the effects of the invention to be maintained. While the concave sections 70 are shared by two pixels in FIG. 15, they can instead be shared by three pixels or more.

In the above example of FIG. 15, two concave sections 70 are formed on the organic passivation film 108 and arranged in the extending direction of a video signal line such that two contact holes are placed between the two concave sections 70. Note however that it is still possible to obtain the effects of the invention when only one of the concave sections 70 is formed. Moreover, instead of forming concave sections on the organic passivation film, it is also possible to provide an opening (removed section) in part of the capacitor insulating film 110. In that case, in order to prevent the pixel electrode and the common electrode from being connected, the capacitor insulating film needs to be removed at a region spaced sufficiently from the terminal section of the opening of the common electrode.

Figure 16:
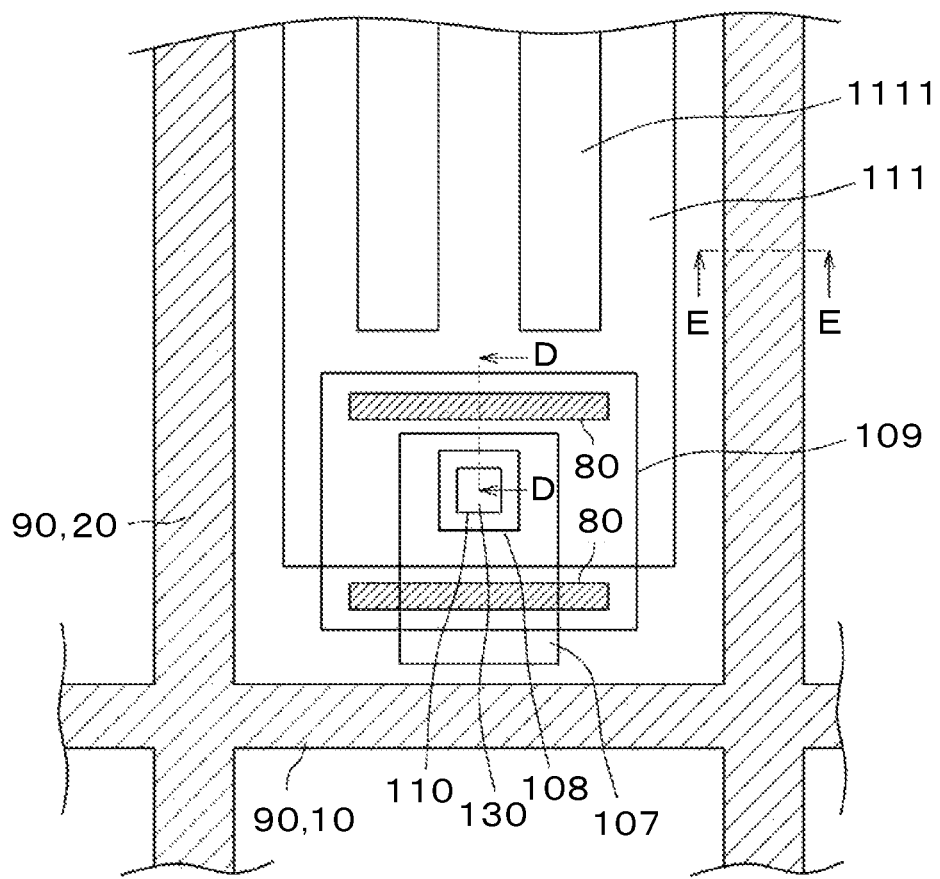
FIG. 16 is a plan view according to Embodiment 2 of the invention.

FIG. 16 is a plan view illustrating a contact hole and its nearby area according to Embodiment 2 of the invention. A feature of Embodiment 2 is that convex sections 80 are formed near a contact hole 130. In Embodiment 1, by forming concave sections on the organic passivation film 108, convex sections are formed close to a contact hole 130, and the alignment film material 112 is guided to flow into the contact hole 130. In Embodiment 2, by contrast, the convex sections 80 are formed directly on the organic passivation film 108 near the contact hole 130, thereby guiding the alignment film material 112 to flow into the contact hole 130.

Figure 17:
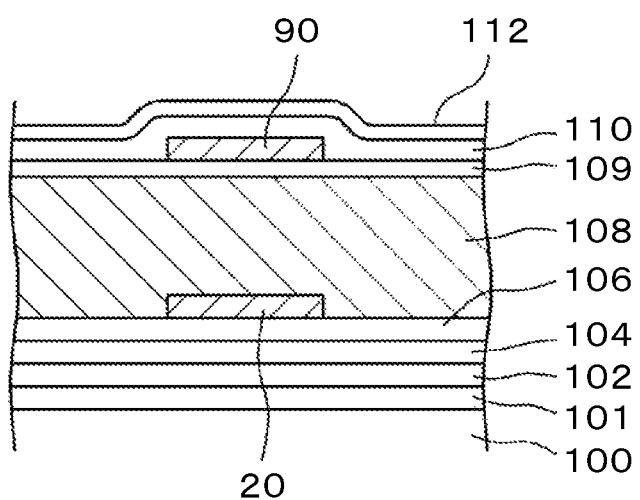
FIG. 17 is a cross section taken along line E-E of FIG. 16.

As illustrated in the plan view of FIG. 16, video signal lines 20 extend vertically, and common metal lines 90 are formed such that they overlap the video signal lines 20. In addition, other common metal lines 90 are formed such that they overlap gate lines 10. The common metal lines 90 are used to prevent voltage decreases at the common electrode 109 formed from indium tin oxide (ITO) of high resistance. FIG. 17 is a cross section taken along line E-E of FIG. 16. As illustrated in FIG. 17, a first undercoat film 101, a second undercoat film 102, a gate insulating film 104, and an inter-layer insulating film 106 are formed above a TFT substrate 100, and a video signal line 20 is formed on the inter-layer insulating film 106. The organic passivation film 108 is formed to cover the video signal line 20, and the common electrode 109 (ITO) is formed on the organic passivation film 108. A common metal line 90 is formed so as to overlap the video signal line 20, and a capacitor insulating film 110 is formed to cover the common metal line 90. Formed on the capacitor insulating film 110 is an alignment film 112.

The common metal line 90 includes Al as its core material and is formed relatively thick (150 to 500 nm thick); thus, it is low in resistance, preventing voltage decreases at the common electrode. The common metal line 90 can instead be created by forming a core Al layer, a lower MoW layer (10 nm thick lower layer preventing oxidation due to ITO), and an upper MoW layer (10 nm thick upper barrier layer). The common metal line 90 can also be formed structurally the same as the video signal line 20. Furthermore, while FIG. 17 illustrates the common metal line 90 as being formed on the common electrode 109, it can instead be formed underneath the common electrode 109.

Figure 18:
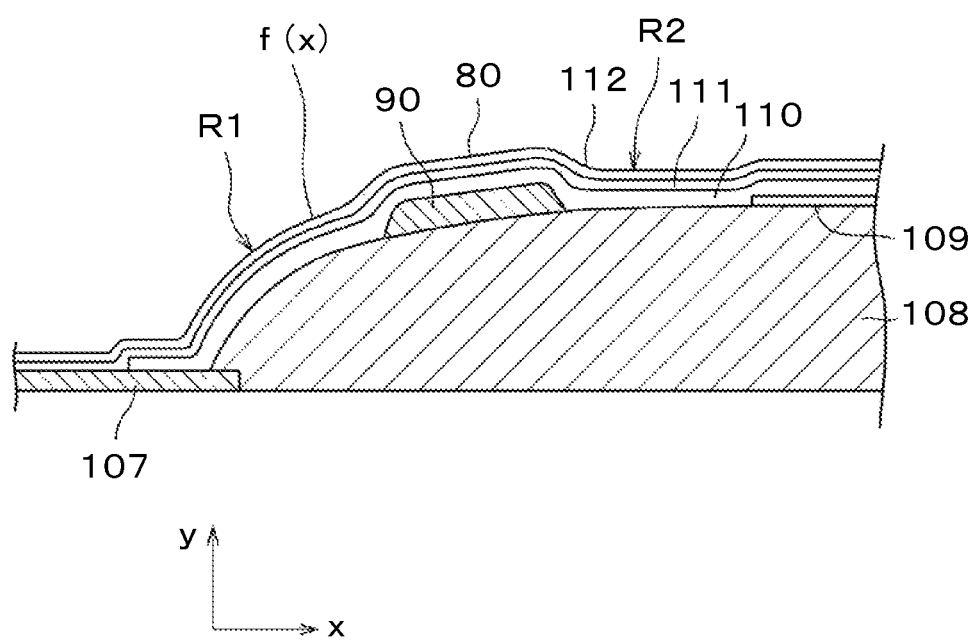
FIG. 18 is a cross section according to Embodiment 2, taken along line D-D of FIG. 16.

A feature of Embodiment 2 is that a convex section 80 is produced by forming the common metal line 90 on the organic passivation film 108 so as to extend from the tapering portion of the contact hole to part of the bulk portion of the organic passivation film 108. FIG. 18 is a cross section obtained from Embodiment 2, which is taken along line D-D of FIG. 16. As illustrated in FIG. 18, the common metal line 90 is formed at the bank portion of the contact hole in the organic passivation film 108, thereby forming the convex section 80.

In FIG. 18, the convex section 80 is formed inside of the opening of the common electrode 109, and the common metal line 90, which is used to form the convex section 80, is thus formed directly on the organic passivation film 108. The capacitor insulating film 110, the pixel electrode 111, and the alignment film 112 are formed to cover the common metal line 90. In FIG. 18, the formation of the convex section 80 near the bank of the contact hole is followed by the formation of a concave section.

In FIG. 18, assume that the edge of the organic passivation film 108 at the contact hole is zero, and the distance in the direction of moving away from the contact hole is x. If the upper curve of the alignment film 112 is represented by $y=f(x)$, then, the sign of the quadratic differential of the curve changes at least once as it gets farther away from the contact hole. In other words, in FIG. 18, the sign of the quadratic differential is negative near the section R1; it turns positive at the section R2. The region where the sign of the quadratic differential changes appears when the distance x from the inner edge of the contact hole is in the range of 4 to 10 μm, and preferably in the range of 5 to 8 μm.

The function f(x) of the upper curve of the alignment film 112 in FIG. 18 can often be approximated to $ax^2+bx^4$. In other words, in the case of FIG. 18 as well, if the upper curve y of the alignment film 112 is represented by $ax^2+bx^4$, the sign of the quadratic differential of the curve y with respect to x will also change once.

Figure 19:
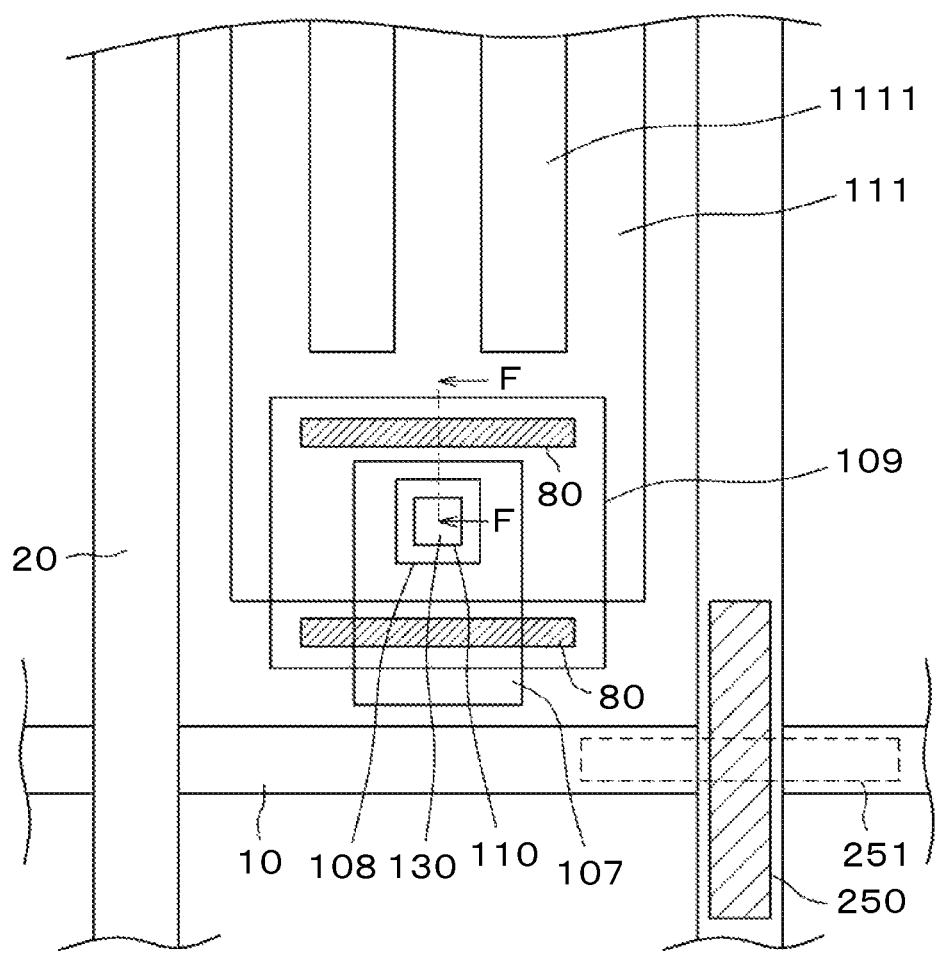
FIG. 19 is a plan view according to a second example of Embodiment 2.

FIG. 19 is a plan view illustrating a contact hole and its nearby area according to another aspect of Embodiment 2. FIG. 19 is the same as FIG. 16 in that the convex section 80 is formed at the bank near the contact hole. In this example, however, the convex section 80 is formed in a different manner: it is formed at the same time as a cross pillar 250 formed on the side of the TFT substrate.

Figure 20:
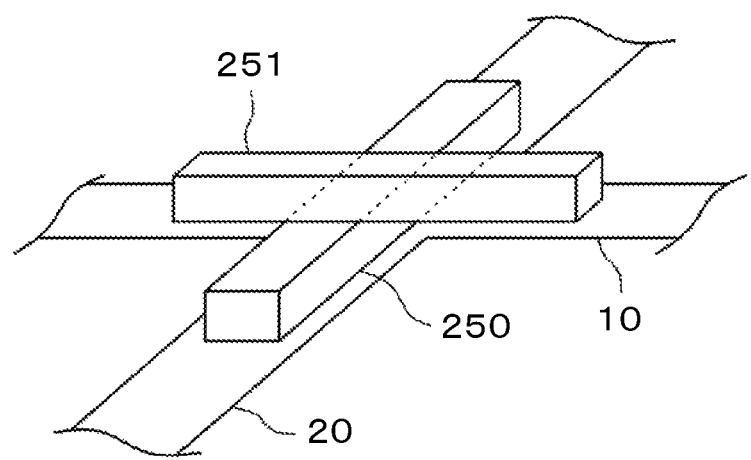
FIG. 20 is a perspective view of a cross pillar.

To maintain a space between the TFT substrate and the counter substrate, there need to be spacers in the display area as well. FIG. 20 is a perspective view illustrating the shape of these spacers. In FIG. 20, a first bar-like spacer 250 is formed on the side of the TFT substrate so as to extend along a video signal line 20, and a second bar-like spacer 251 is formed on the side of the counter substrate so as to extend along a gate line 10. The first and second spacers 250 and 251 are crossed and in touch with each other to secure a space between the TFT substrate and the counter substrate.

This is also illustrated in the plan view of FIG. 19. As illustrated in FIG. 19, at the intersection between the gate line 10 and the video signal line 20, the first spacer 250 is formed above the video signal line 20 in the plan view. Also, the second spacer 251 is formed above the gate line 10 in the plan view. Since the second spacer 251 is formed on the side of the counter substrate, it is represented by a dotted line in FIG. 19.

In FIG. 19, two convex sections 80 are formed such that the contact hole 130 is placed between them. The convex sections 80 are formed at the same time as the first spacer 250. The height of the convex sections 80 is much smaller than the height of the first spacer 250. Since the first spacer 250 is formed by photolithography, the use of half exposure allows the simultaneous formation of the convex sections 80 having a smaller height and the first spacer 250.

A cross section taken along line F-F of FIG. 19 is the same as that of FIG. 18. Note however that in FIG. 19, the convex sections 80 are not formed of the common metal lines, but of the same material as that of the pillar spacer (i.e., organic material). The effects obtained from FIG. 19 are the same as those obtained from FIGS. 16 and 18.

As stated above, in the above alternative example of Embodiment 2, two convex sections 80 are formed such that the contact hole 130 is placed between them. However, it is still possible to obtain the effects of the invention when only one of the two is formed.

The above explanation is based on the assumption that the pixel electrode is located above the common electrode. On the other hand, a common electrode having slits can be formed above a planar pixel electrode via a capacitor insulating film, and the invention can also be applied to an IPS LCD with such a structure.

In addition to IPS LCDs, the invention can also be applied to LCDs having an organic passivation film in which contact holes are formed.

What is claimed is:

1. A liquid crystal display device comprising:
    a TFT substrate having a first video signal line, a second video signal line arranged in a first direction of the first video signal line, a first gate line, a second gate line arranged in a second direction of the first gate line, which crosses the first direction, and a TFT electrically connected to the first gate line and the first video signal line;
    a counter substrate; and
    a liquid crystal layer placed between the TFT substrate and the counter substrate,
    wherein an organic insulating film is formed between the TFT substrate and the liquid crystal layer, an inorganic insulating film is formed between the organic insulating film and the liquid crystal layer, an alignment film is formed between the inorganic insulating film and the liquid crystal layer, a first transparent electrode is connected to the TFT and formed between the inorganic insulating film and the alignment film, and a second transparent electrode is formed between the organic insulating film and the inorganic insulating film,
    wherein a pixel is in an area surrounded by the first gate line, the second gate line, the first video signal line, and the second video signal line,
    wherein the first transparent electrode and the TFT are connected to each other via a contact hole formed in the organic insulating film in the pixel,
    wherein, in the pixel, the organic insulating film has a first concave section extending in the first direction and a second concave section extending in parallel with the first concave section, the first and second concave sections are located near the contact hole, the contact hole is between the first concave section and the second concave section in the second direction, the first concave section is between the first gate line and the contact hole in the second direction, the second concave section is between the contact hole and the second gate line in the second direction, in a plan view,
    wherein the second transparent electrode has an opening portion, the opening portion overlaps with the contact hole, the second transparent electrode directly contacts with a bottom of the second concave section, and wherein the first concave section and the second concave section are in a linear shape, the linear shape has a long axis in the first direction, the long axis of each of the first and second concave section is longer than the opening portion in the first direction.

2. The liquid crystal display device of claim 1, wherein the organic insulating film has a convex section, the convex section and the second concave section are located in a range of 3 to 8 μm from an edge of the organic insulating film at the contact hole.

3. The liquid crystal display device of claim 2, wherein a height of the convex section is in a range of 0.3 to 1 μm.

4. The liquid crystal display device of claim 1 wherein the organic insulating film has a convex section, the convex section and the concave section are formed at a region that is spaced from a connection point, which is between the first transparent electrode and the TFT, in the second direction.

5. The liquid crystal display device of claim 1, wherein concave sections in the pixel are only two, which are the first concave section and the second concave section.

6. The liquid crystal display device of claim 5, wherein the first transparent electrode has at least two linear electrodes and at least one slit, which is formed between the two linear electrodes, wherein the TFT has a contact electrode connected to the first transparent electrode in the contact hole, wherein the two linear electrodes and the slit do not overlap with the second concave section, the contact electrode overlaps with the first concave section, the contact electrode does not overlap with the second concave section, in a plan view, and wherein the organic insulating film has a flat section between the second concave section and the second gate line, the two linear electrodes and slit are located at the flat section.

7. The liquid crystal display device of claim 6, wherein the organic insulating film has a convex section, the convex section is located between the contact hole and the second concave portion in a plan view, the second concave section is located in a range of 4 to 10 μm from an edge of the organic insulating film at the contact hole.

8. The liquid crystal display device of claim 6, the organic insulating film further has a convex section which is adjacent to the second concave section between the second concave section and the contact hole in the second direction, wherein, in a plan view, the bottom of the second concave section directly contacts the second transparent electrode, an edge of the opening portion of the second transparent electrode is located between an apex of the convex section and the bottom of the second concave section, the apex of the convex section is located between the bottom of the second concave section and the contact hole.

9. The liquid crystal display device of claim 8, wherein the first concave section and the second concave section extend in the first direction beyond the first video signal line and the second video signal line.

* * * * *